(12) United States Patent
Kim et al.

(10) Patent No.: US 9,634,016 B2
(45) Date of Patent: Apr. 25, 2017

(54) SEMICONDUCTOR DEVICE AND METHOD OF MANUFACTURING THE SAME

(71) Applicant: SK hynix Inc., Gyeonggi-do (KR)

(72) Inventors: Won Ki Kim, Gyeonggi-do (KR); Jong Man Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/855,754

(22) Filed: Sep. 16, 2015

(65) Prior Publication Data

US 2016/0005745 A1    Jan. 7, 2016

Related U.S. Application Data

(62) Division of application No. 14/497,083, filed on Sep. 25, 2014, now Pat. No. 9,165,938.

(30) Foreign Application Priority Data

Jun. 3, 2014  (KR) ........................ 10-2014-0067861

(51) Int. Cl.
*H01L 29/792* (2006.01)
*H01L 29/775* (2006.01)
(Continued)

(52) U.S. Cl.
CPC ............ *H01L 27/115* (2013.01); *H01L 21/28* (2013.01); *H01L 21/823437* (2013.01);
(Continued)

(58) Field of Classification Search
CPC ....... H01L 29/87; H01L 29/747; H01L 29/00;
H01L 27/026; H01L 29/102; H01L 27/0262; H01L 27/11519; H01L 27/11548; H01L 27/11556; H01L 27/11565; H01L 27/11575; H01L 27/11582; H01L 21/28; H01L 21/823437; H01L 27/115
(Continued)

(56) References Cited

U.S. PATENT DOCUMENTS

2006/0060945 A1*  3/2006  Cho ...................... H01L 23/544
                                                           257/622
2008/0014734 A1*  1/2008  Hong ................ H01L 21/76816
                                                           438/597
(Continued)

*Primary Examiner* — Dale E Page
*Assistant Examiner* — Long H Le
(74) *Attorney, Agent, or Firm* — IP & T Group LLP

(57) ABSTRACT

A semiconductor device includes a substrate having a cell region, wherein a contact region, page buffer regions, and a scribe lane region are defined around the cell region; a cell structure located in the cell region, including first conductive layers and first insulating layers which are alternately stacked, and having a non-stepped shape; a contact structure located in the contact region, including second conductive layers and second insulating layers which are alternately stacked, and having a stepped shape; a first dummy structure located in the page buffer region, including first sacrificial layers and third insulating layers which are alternately stacked, and having the non-stepped shape; and a second dummy structure located in the scribe lane region, including second sacrificial layers and fourth insulating layers which are alternately stacked, and having the stepped shape.

15 Claims, 10 Drawing Sheets

(51) Int. Cl.
| | |
|---|---|
| *H01L 27/115* | (2017.01) |
| *H01L 21/8234* | (2006.01) |
| *H01L 21/28* | (2006.01) |
| *H01L 27/11519* | (2017.01) |
| *H01L 27/11548* | (2017.01) |
| *H01L 27/11556* | (2017.01) |
| *H01L 27/11565* | (2017.01) |
| *H01L 27/11575* | (2017.01) |
| *H01L 27/11582* | (2017.01) |

(52) U.S. Cl.
CPC .. *H01L 27/11519* (2013.01); *H01L 27/11548* (2013.01); *H01L 27/11556* (2013.01); *H01L 27/11565* (2013.01); *H01L 27/11575* (2013.01); *H01L 27/11582* (2013.01)

(58) Field of Classification Search
USPC .......................................................... 257/110
See application file for complete search history.

(56) References Cited

U.S. PATENT DOCUMENTS

2008/0067690 A1\* 3/2008 Kumagai ................ H01L 21/78
257/774
2010/0133599 A1\* 6/2010 Chae .................. H01L 27/11578
257/315
2012/0003831 A1\* 1/2012 Kang ................ H01L 27/11551
438/639

\* cited by examiner

SEMICONDUCTOR DEVICE AND METHOD OF MANUFACTURING THE SAME

CROSS-REFERENCE TO RELATED APPLICATION

This application is a division of U.S. patent application Ser. No. 14/497,083 filed on Sep. 25, 2014, which claims priority to Korean patent application number 10-2014-0067861, filed on Jun. 3, 2014. The entire disclosure of each of the foregoing application is incorporated herein in its entirety by reference.

BACKGROUND

Field of the Invention

The present invention relates to a semiconductor device and a method of manufacturing the same. More specifically, the present invention relates to a semiconductor device having a three-dimensional structure and a method of manufacturing the same.

Discussion of Related Art

A non-volatile memory device is a memory device in which stored data is maintained even when its power supply is cut off. Recently, non-volatile memory devices having two-dimensional structures, in which memory cells are formed on a substrate in a single layer, have reached their limit in terms of increasing integration. Therefore, a non-volatile memory device having a three-dimensional structure, with vertically stacked memory cells, has been proposed.

A non-volatile memory device having a three-dimensional structure includes interlayer insulating layers and gate electrodes which are alternately stacked, and channel layers penetrating the interlayer insulating layers and the gate electrodes, wherein the memory cells are stacked along the channel layers. Additionally, when manufacturing a three-dimensional structure, after stacking oxide layers and nitride layers, the gate electrodes are formed by replacing the nitride layers with conductive layers.

However, there is a concern in that the process of replacing the nitride layers with the conductive layers is highly difficult. Specifically, the stacked structure may tilt or collapse during the process of replacing the nitride layers with conductive layers.

SUMMARY

Various embodiments of the present invention are directed to a semiconductor device having a stable stacked structure, and a method of manufacturing the same.

An embodiment provides a semiconductor device including a substrate in which a cell region, and contact regions, a page buffer region, and a scribe lane region located around the cell region are defined; contact structures located in the contact regions, including second conductive layers and second insulating layers which are alternately stacked, and having a stepped shape; a cell structure located in the cell region, including first conductive layers and first insulating layers which are alternately stacked, and having a different shape from the contact structures; a first dummy structure located in the page buffer region, including first sacrificial layers and third insulating layers which are alternately stacked, and having the different shape from the contact structures; and a second dummy structure located in the scribe lane region, including second sacrificial layers and fourth insulating layers which are alternately stacked, and having the stepped shape.

Another embodiment provides a semiconductor device including: cell structures arranged in a first direction and a second direction crossing the first direction, and including first conductive layers and first insulating layers which are alternately stacked; first dummy structures located between the cell structures which are adjacent in the first direction, and including first sacrificial layers and second insulating layers which are alternately stacked; first blocking insulators disposed between the cell structures and the first dummy structures; and contact structures located between the cell structures which are adjacent in the second direction, having sidewalls which are in contact with the cell structures, and including second conductive layers and third insulating layers which are alternately stacked.

Still another embodiment provides a method of manufacturing a semiconductor device including: forming a stacked structure in which first material layers and the second material layers are alternately stacked on a substrate in which a cell region, contact regions, a page buffer region, and a scribe lane region located around the cell region are defined; and patterning the stacked structure, and forming a cell structure having a non-stepped shape located in the cell region, a contact structure having a stepped shape located in the contact region, a first dummy structure having the non-stepped shape located in the page buffer region, and a second dummy structure having the stepped shape located in the scribe lane region.

BRIEF DESCRIPTION OF THE DRAWINGS

The above and other features and advantages of the present invention will become more apparent to those of ordinary skill in the art after describing in detail various embodiments with reference to the attached drawings in which.

DETAILED DESCRIPTION

Figure 1A:
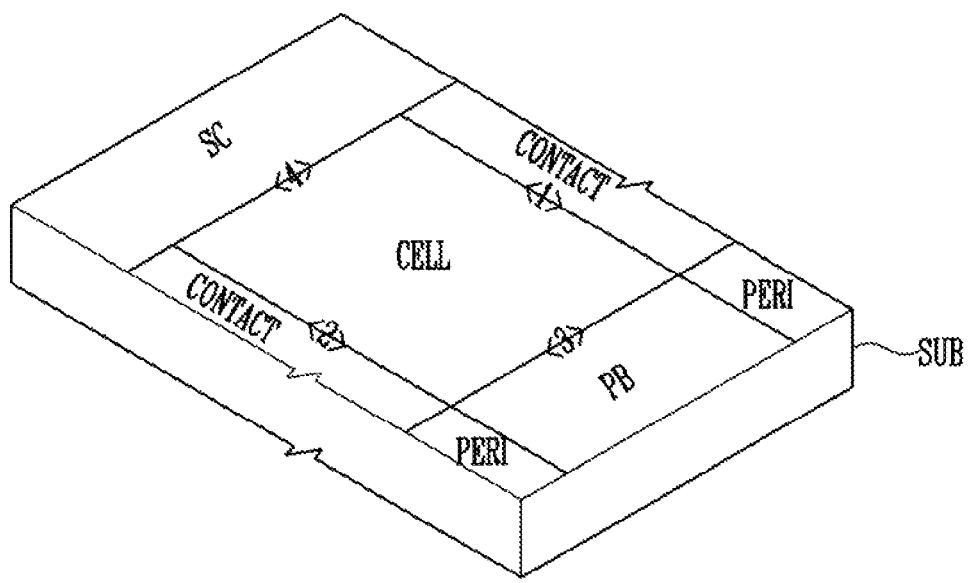
FIGS. 1A and 1B are perspective views illustrating a structure of a semiconductor device according to an embodiment.

The present invention will be described with reference to the accompanying drawings, in which various embodiments of the present invention are shown. In the drawings, thicknesses and spaces may be exaggerated compared to actual physical thicknesses and spaces. In the description, known configurations that are not central to the gist of the present invention may be omitted. In the figures, like numerals refer to like components. Additionally, "embodiments" refer to embodiments of the present invention.

Figure 1B:
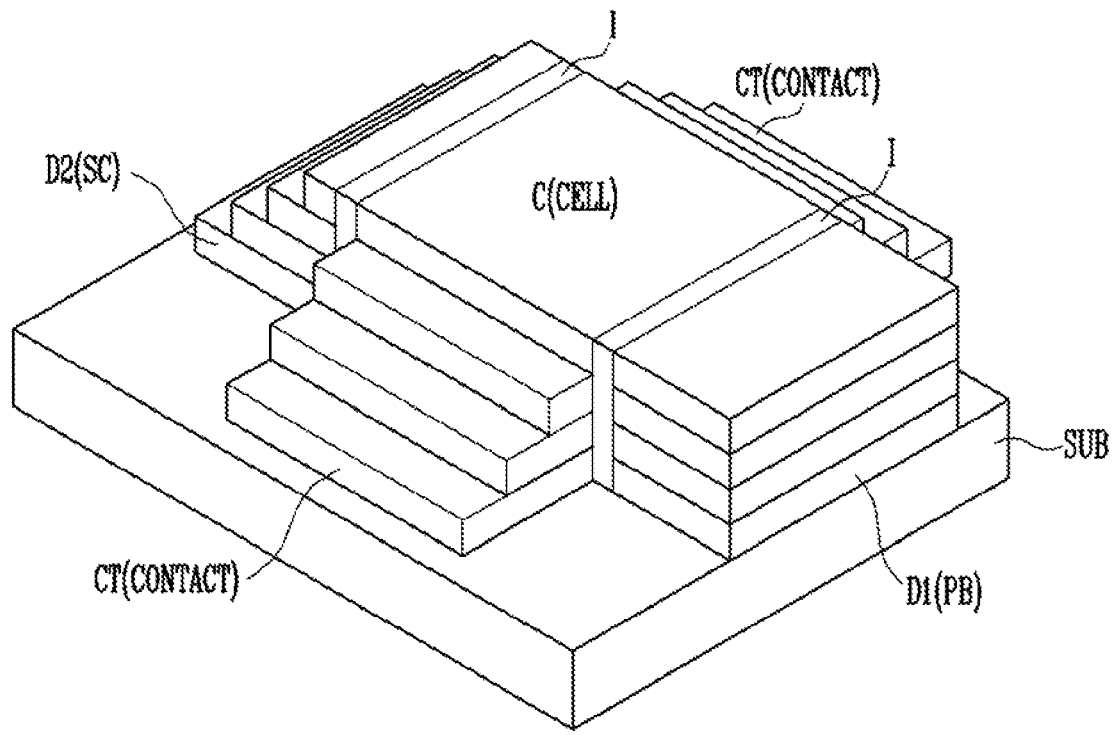

FIG. 1A is a perspective view illustrating a region of a semiconductor device according to an embodiment, and FIG. 1B is a perspective view illustrating a stacked structure included in a semiconductor device according to an embodiment.

As shown in FIG. 1A, a cell region CELL, a contact region CONTACT, a page buffer region PB, and a scribe lane region SC may be defined on a substrate SUB.

The cell region CELL may be a region in which a cell array is located, and memory cells for storing data may be formed. For example, strings in which at least one source select transistor, memory cells, and at least one drain select transistor are connected in series may be formed in the cell region CELL. The strings may be extended in a horizontal direction and stacked in a vertical direction, or be protruded from a surface of the substrate SUB and having a straight type. In another example, strings in which at least one source select transistor, source side memory cells, at least one pipe transistor, drain side memory cells, and at least one drain select transistor are connected in series may be formed in the cell region CELL. The strings may be arranged in a U shape.

The contact region CONTACT may connect the stacked select lines or stacked word lines and contact plugs to drive each of the stacked select transistors or memory cells. For example, when first to fourth sides <1> to <4> of the cell region CELL are defined, the contact regions CONTACT which are in contact with the first <1> and second sides <2> that face each other may be defined.

The page buffer region PB may be a region in which a page buffer is formed, and the page buffer may be used as a temporary buffer in which data input/output to/from a selected page in the cell array is temporarily stored. The scribe lane region SC may be a region between chips, wherein an align mark, an overlay mark, a test pattern, etc., are formed. For example, when the third side <3> and the fourth side <4> of the cell region CELL face each other, a page buffer region PB which is in contact with the third side <3> may be defined, and the scribe lane region SC which is in contact with the fourth side <4> may be defined.

In addition, a peripheral region PERI may be defined between the adjacent page buffer region PB and the contact region CONTACT. The peripheral region PERI may have a peripheral circuit for driving the strings.

As shown in FIG. 1B, a cell structure C, contact structures CT, a first dummy structure D1, and a second dummy structure D2 may be formed on the substrate SUB.

The cell structure C may be formed in the cell region CELL of the substrate SUB, include first conductive layers and first insulating layers which are alternately stacked, and have a different shape from the contact structure CT. For example, the cell structure has a non-stepped shape such as a block shape. The contact structure CT may be formed in the contact region CONTACT of the substrate SUB, include second conductive layers and second insulating layers which are alternately stacked, and have a stepped shape. The first conductive layers and the second conductive layers may be formed at the same height, and the first conductive layer and the second conductive layer may be connected as a single layer. Further, the first insulating layers and the second insulating layers may be formed at the same height, and the first insulating layer and the second insulating layer may be connected as a single layer.

The first dummy structure D1 may be formed in the page buffer region PB of the substrate SUB, may include first sacrificial layers and third insulating layers which are alternately stacked, and have a non-stepped shape. The first sacrificial layers and the first conductive layers may be formed at the same height, and the third insulating layers and the first insulating layers may be formed at the same height. The first insulating layer and the third insulating layer may be connected as a single layer. Further, the first sacrificial layers may be insulating layers such as nitride layers, etc.

The second dummy structure D2 may be formed in the scribe lane region SC of the substrate SUB, include second sacrificial layers and fourth insulating layers, and have a stepped shape. The second sacrificial layers and the first conductive layers may be formed at the same height, and the fourth insulating layers and the first insulating layers may be formed at the same height. The first insulating layer and the fourth insulating layer may be connected as a single layer. Further, the second sacrificial layers may be insulating layers such as nitride layers, etc.

Blocking insulators I may be formed between the cell region CELL and the scribe lane region SC and between the cell region CELL and the page buffer region PB. For example, the blocking insulators I may be disposed between the cell structure C and the first dummy structure D1, and between the cell structure C and the second dummy structure D2. Further, the blocking insulator I may be extended to a sidewall of the contact structure CT.

Although not shown in the accompanying drawings, a third dummy structure (not shown) having a non-stepped shape may be located in the peripheral region PERI. For example, the third dummy structure in which third sacrificial layers and fifth insulating layers are alternately stacked may be formed in the peripheral region PERI of the substrate SUB.

For reference, each stage in the structures having a stepped shape may be formed by at least one conductive layer or a sacrificial layer, and at least one insulating layer. An insulating layer, a conductive layer, or a sacrificial layer may be formed in the uppermost layer of each stage. For example, each stage includes the same number of layers, however the number of layers included in each stage may vary. Moreover, one contact region may be divided into multiple regions, and it may be possible to form a staircase structure so that the divided regions are stepped.

Figure 2A:
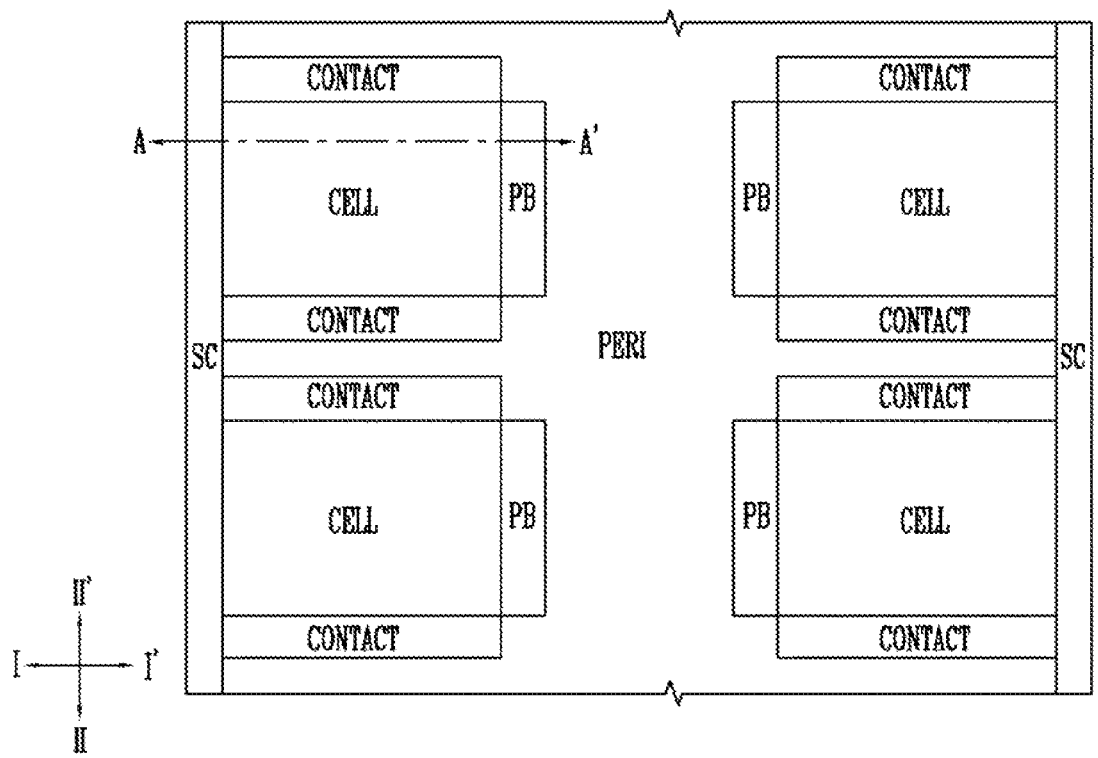
FIGS. 2A to 2B are diagrams for describing a method of manufacturing a semiconductor device according to an embodiment.
Figure 2B:
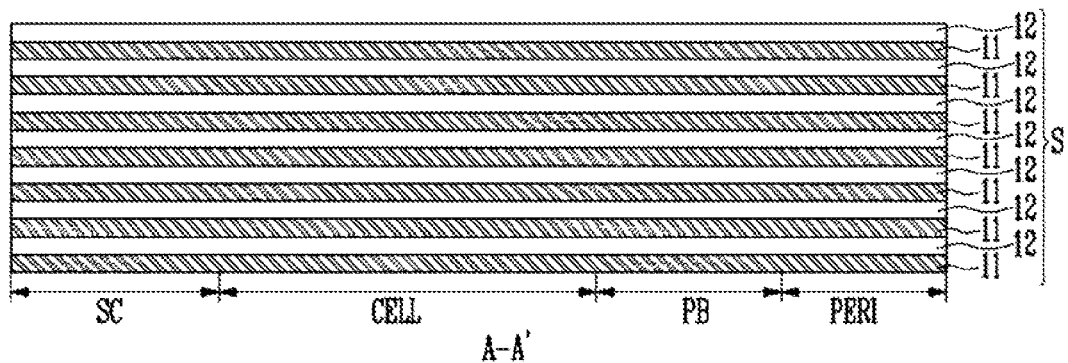
Figure 3A:
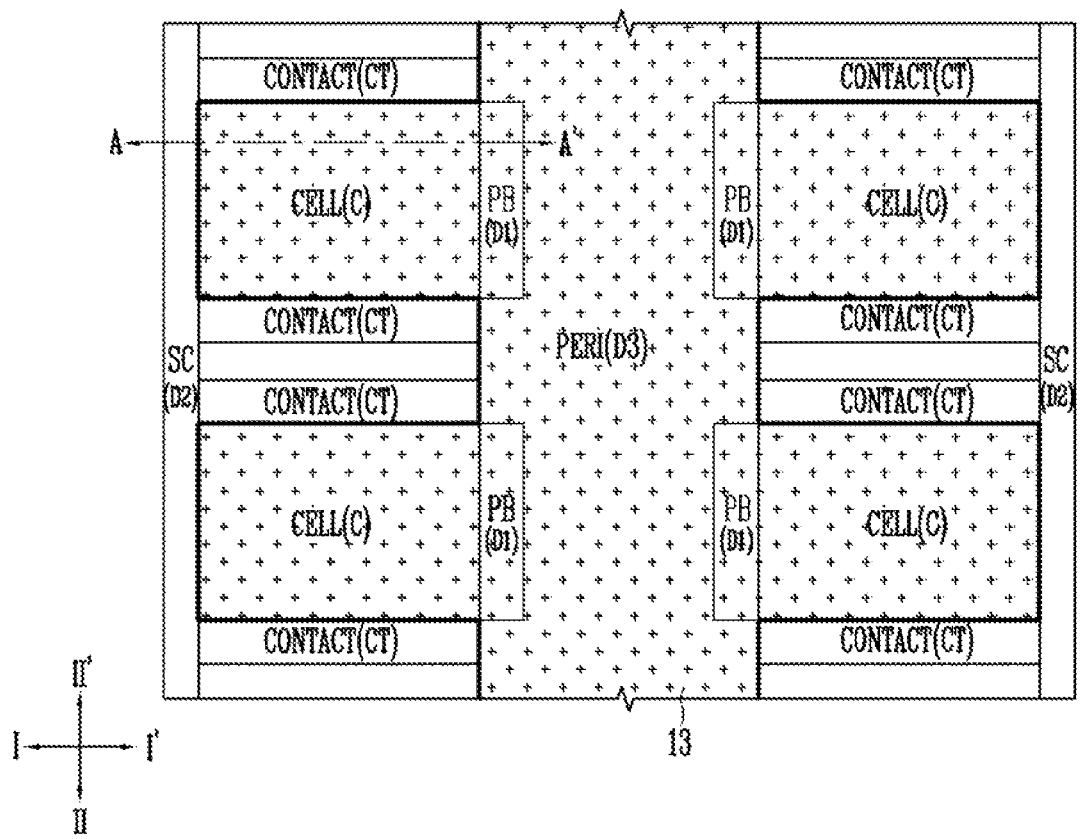
FIGS. 3A to 3B are diagrams for describing a method of manufacturing a semiconductor device according to an embodiment.
Figure 3B:
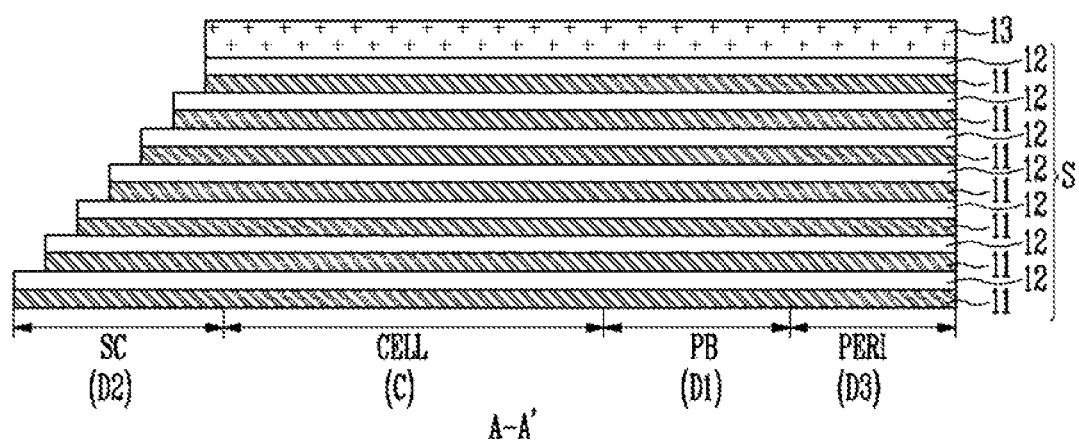
Figure 4A:
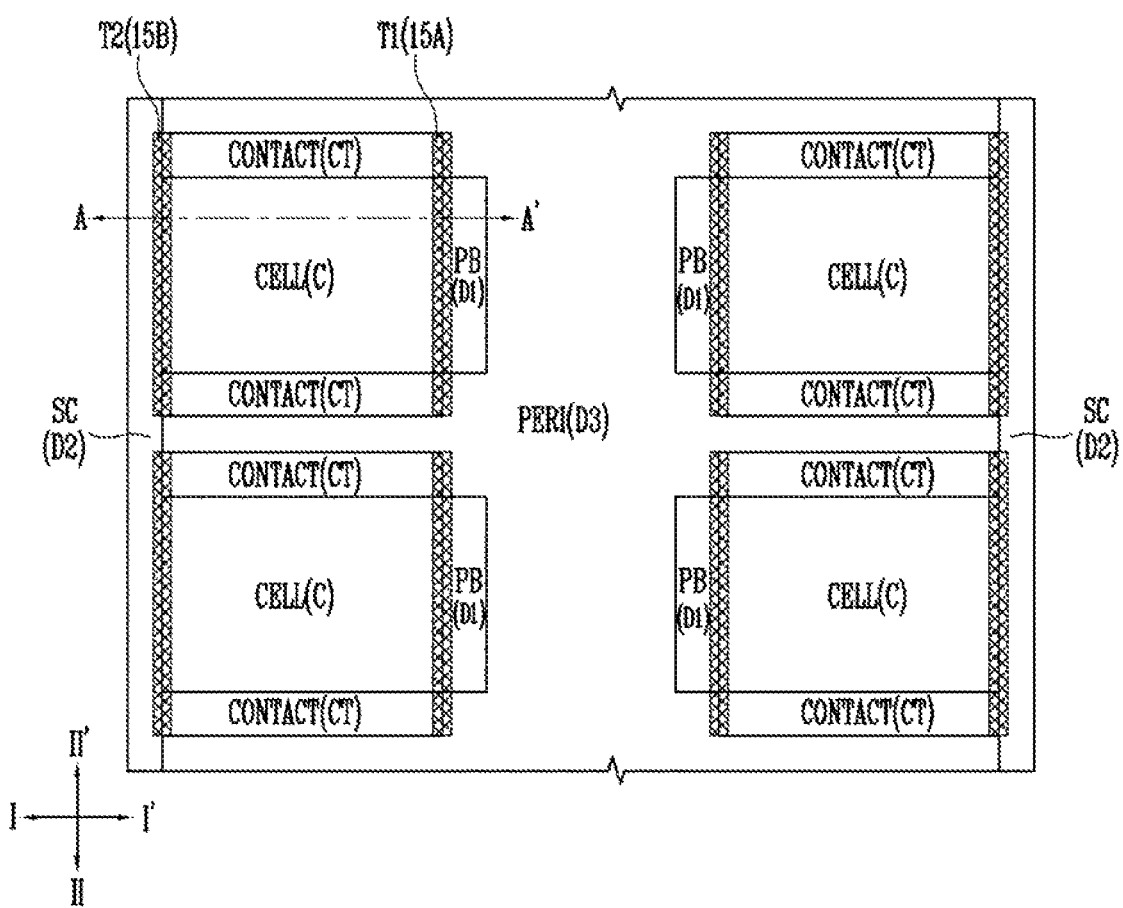
FIGS. 4A to 4C are diagrams for describing a method of manufacturing a semiconductor device according to an embodiment.
Figure 4B:
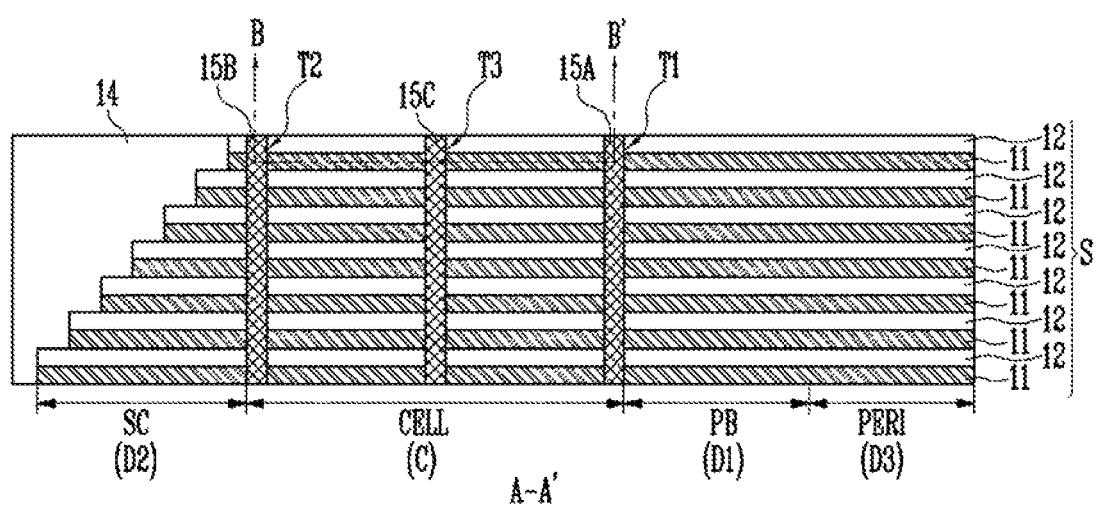
Figure 4C:
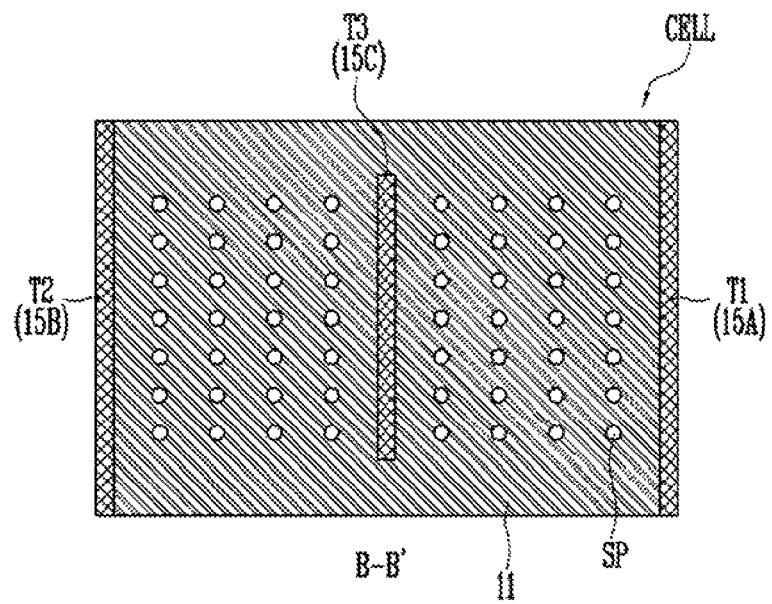
Figure 5A:
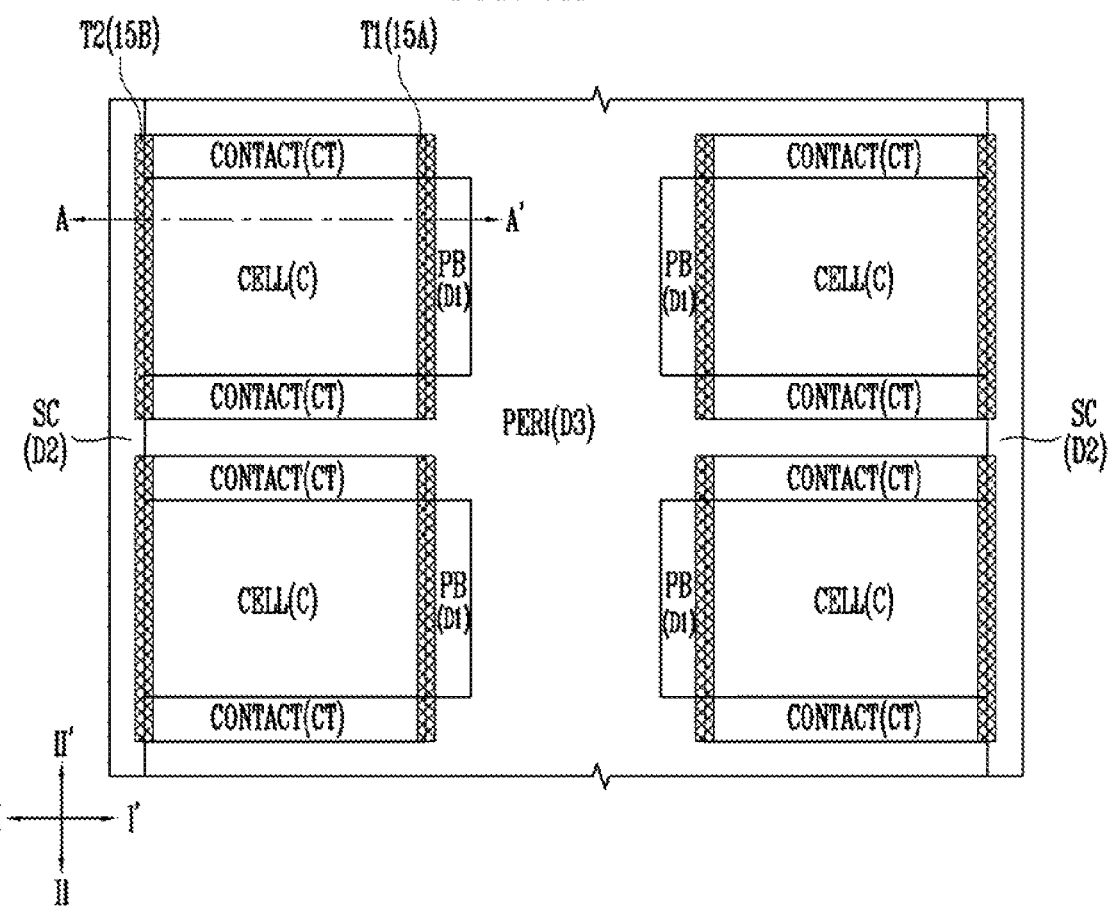
FIGS. 5A to 5C are diagrams for describing a method of manufacturing a semiconductor device according to an embodiment.
Figure 5B:
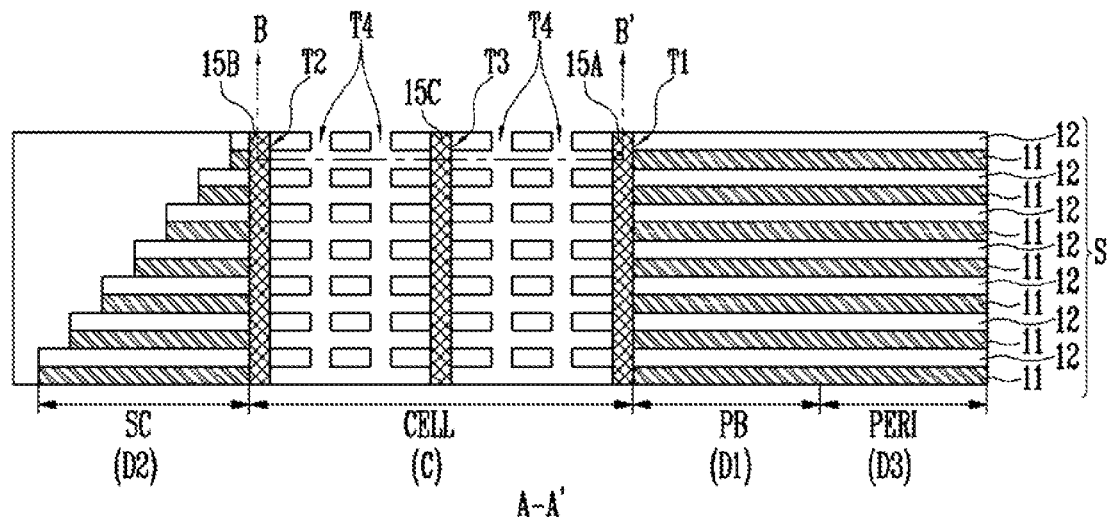
Figure 5C:
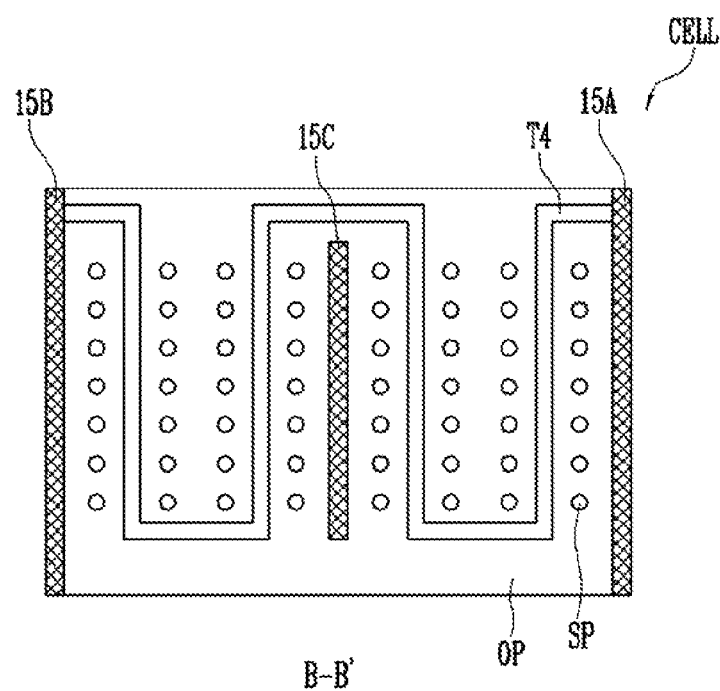
Figure 6A:
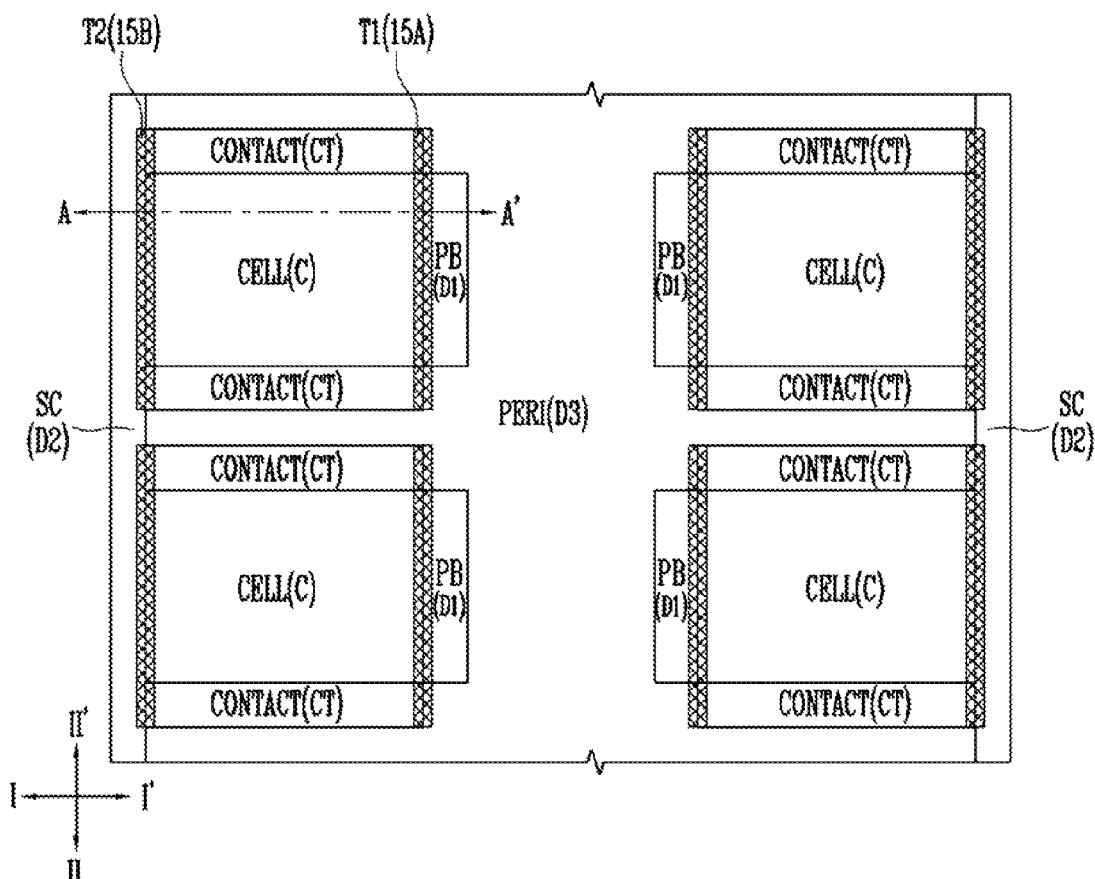
FIGS. 6A to 6C are diagrams for describing a method of manufacturing a semiconductor device according to an embodiment.
Figure 6B:
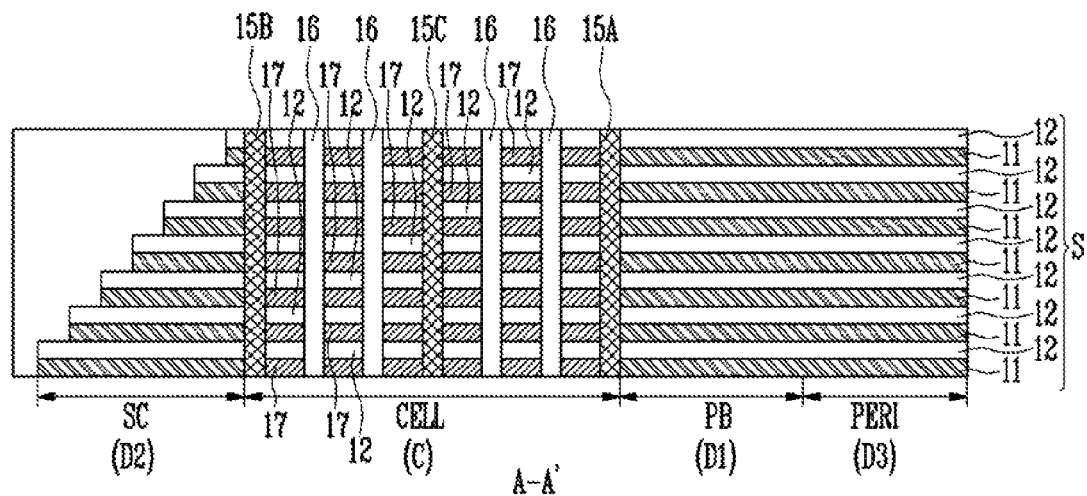
Figure 6C:
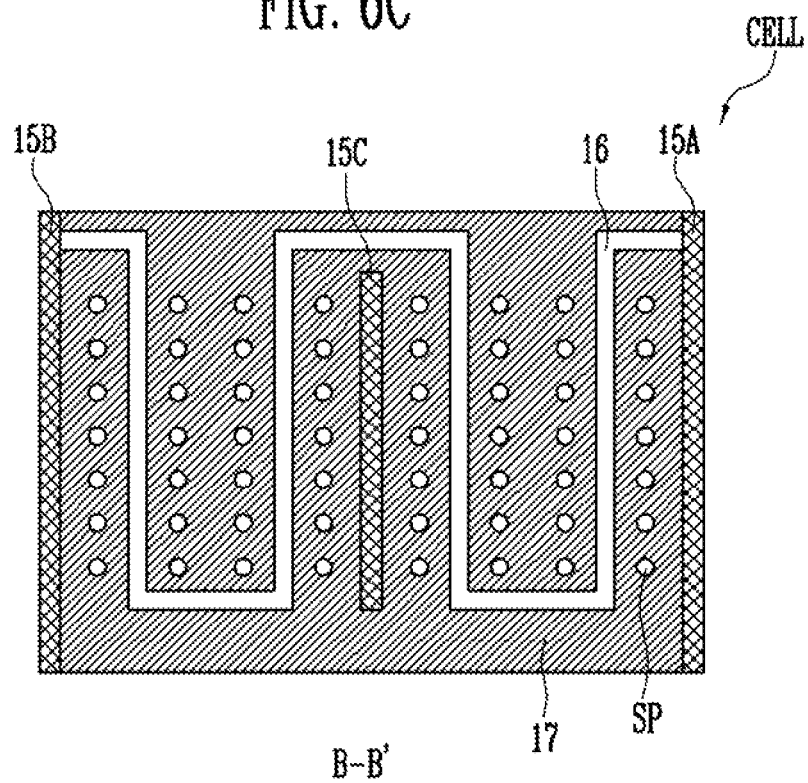

FIGS. 2A to 6A, 2B to 6B, 4C to 6C are diagrams for describing a method of manufacturing a semiconductor device according to an embodiment. FIGS. 2A, 3A, 4A, 5A, and 6A are layout diagrams of a chip, FIGS. 2B, 3B, 4B, 5B, and 6B are cross-sectional views taken along lines A-A' of FIGS. 2A, 3A, 4A, 5A, and 6A, respectively. FIGS. 4C, 5C, and 6C are layout diagrams of cell regions of FIGS. 4B, 5B, and 6B, respectively.

As shown in FIGS. 2A and 2B, a stacked structure S may be formed on a substrate SUB in which cell regions CELL, contact regions CONTACT, page buffer regions PB, scribe lane regions SC, and a peripheral region PERI are defined.

Cell regions CELL may be arranged in a first direction I-I' and a second direction II-II' crossing the first direction I-I'. Further, the contact region CONTACT, the page buffer region PB, the contact region CONTACT, and the scribe lane region may be sequentially defined around each cell region CELL.

The page buffer region PB may be defined between the cell regions CELL which are adjacent in the first direction I-I', and the contact region CONTACT may be defined between the cell regions CELL which are adjacent in the second direction II-II'. That is, the contact region CONTACT, the page buffer region PB, and the scribe lane region located around the cell regions CELL may be arranged symmetrically in a mirrored fashion. Further, the scribe lane regions SC, which are adjacent in the second direction II-II', may be connected to each other. That is, the scribe lane region SC may be defined as a line and extended in the second direction II-II'.

The stacked structure S may include first material layers 11 and second material layers 12, which are alternately stacked. The first material layers 11 may be used for forming a gate electrode of a select transistor, a memory cell transistor, etc., and the second material layers 12 may be used for forming an insulating layer that electrically disconnects the stacked gate electrodes.

The first material layers 11 may have high etch selectivity with respect to the second material layers 12. For example, the first material layers 11 may be formed as a sacrificial layer including a nitride, and the second material layers 12 may be formed as an insulating layer including an oxide. In another example, the first materials 11 may be formed as a first sacrificial layer including a nitride, and the second material layers 12 may be formed as a second sacrificial layer including an oxide.

Next, although not shown in the accompanying drawings, semiconductor patterns penetrating the stacked structure S may be formed. The semiconductor patterns may be channel layers. For example, after forming holes penetrating the first and second material layers 11 and 12 in the cell region CELL, the semiconductor patterns may be formed inside the holes. Center portions of the semiconductor patterns may be opened or filled, or a combination thereof. The opened center portions may be filled with an insulating layer. In addition, before forming the semiconductor pattern, a dielectric layer may be formed in the hole. The dielectric layer may include at least one among a charge blocking layer, a data storage layer, and a tunnel insulating layer. The data storage layer may include polysilicon, nitride, a phase change material, nanodots, etc.

For reference, FIG. 2B illustrates only the stacked structure S by omitting the substrate SUB, etc., but various structures may be formed between the substrate SUB and the stacked structure S. For example, a structure such as a pipe gate, a source layer, or the like may be formed.

As shown in FIGS. 3A and 3B, after forming a mask pattern 13 on the stacked structure S, the stacked structure S may be patterned using the mask pattern 13. By repeatedly performing the process of reducing the mask pattern 13 and etching the stacked structure S, the contact region CONTACT and the scribe lane region SC of the stacked structure S may be formed in a stepped shape.

A first mask pattern (not shown) may be formed to cover a portion of the contact region CONTACT, a portion of the scribe lane region SC, the cell region CELL, and the page buffer region PB. Further, the mask pattern may cover the cell region CELL and the page buffer region PB, and the stacked structure S may be etched a number of times while reducing the mask pattern so that the contact region CONTACT and the scribe lane region SC are gradually exposed. That is, the process of reducing the mask pattern 13 and etching the stacked structure S may be repeatedly performed.

FIG. 3A illustrates a final mask pattern. Specifically, the final mask pattern 13 may cover the cell region CELL and the page buffer region PB, and expose the contact region CONTACT and the scribe lane region SC. For example, the final mask pattern 13 may have a shape in which line patterns are extended in the first direction I-I' and intersect a line pattern extended in the second direction II-II'. Only a portion of the peripheral region PERI may be covered by the mask pattern 13, and the remaining portion of the peripheral region PERI may be exposed. For example, the peripheral region PERI between the page buffer regions PB may be covered by the mask pattern 13, and the peripheral region PERI between the contact regions CONTACT, which are adjacent in the second direction II-II', may be exposed.

Therefore, the scribe lane region SC and the contact region CONTACT of the stacked structure S may be patterned in a stepped shape. Accordingly, the stacked structure S may include a cell structure C having a non-stepped shape located in the cell region CELL, a contact structure CT having a stepped shape located in the contact region CONTACT, a first dummy structure D1 having a non-stepped shape located in the page buffer region PB, and a second dummy structure D2 having a stepped shape located in the scribe lane region SC.

Further, the peripheral region PERI may have a structure with a non-stepped shape or the peripheral region PERI may have no structure at all. For example, a third dummy structure D3 having a non-stepped shape may be located in the peripheral region PERI that is located between the page buffer regions PB and covered by the mask pattern 13, and the stacked structure S may be removed from the peripheral region PERI that is located between the contact regions CONTACT, which are adjacent in the second direction II-II' and are exposed by the mask pattern 13.

As shown in FIGS. 4A to 4C, after forming an interlayer insulating layer 14 on the patterned stacked structure S, the interlayer insulating layer 14 may be planarized to expose an upper surface of the stacked structure S. Next, a first trench T1 penetrating the stacked structure S and located on the border between the page buffer region PB and the cell region CELL may be formed.

When removing subsequent first materials 11, the first trench T1 may be used for forming a protective layer to prevent the first material layers 11 formed in the page buffer region PB from being removed. The first trench T1 may be formed to have a depth that exposes all of the first material layers 11.

For example, a carbon-based mask layer, an antireflection layer such as silicon oxynitride (SiON), etc., and a photoresist pattern may be sequentially formed on the interlayer insulating layer 14 and the stacked structure S, and the mask pattern may be formed by etching the antireflection layer and the mask layer, using the photoresist pattern as a barrier. The first trench T1 may be formed by etching the stacked structure S using the mask pattern as a barrier.

When forming the first trench T1, a second trench T2, located on the border between the cell region CELL and the scribe lane region SC, may be formed together with the first trench T1. When removing subsequent first material layers 11, the second trench T2 may be used for forming a protective layer to prevent the first material layers 11 in the scribe lane region SC from being removed. The second trench T2 may have a depth that exposes all of the first material layers 11.

In addition, when forming the first trench T1, at least one third trench T3, located in the cell region CELL and penetrating the cell structure C, may be formed together with the first trench T1. When removing the subsequent first material layers 11, the third trench T3 may be used to form a supporter that prevents the second material layers 12 that remain in the cell region CELL from tilting or collapsing. The third trench T3 may be located between the semiconductor patterns SP. The first to third trenches T1 to T3 may have the same length, or different lengths in the II-II' direction.

An insulating layer filling the first to third trenches T1 to T3 may be formed. Therefore, at least one supporting insulator 15C penetrating the cell structure C, a first blocking insulator 15A disposed between the first dummy structure D1 and the cell structure C, and a second blocking insulator 15B disposed between the second dummy structure D2 and the cell structure C may be formed. For reference, the third trench T3 and the supporting insulator 15C may be formed in the contact region CONTACT.

As shown in FIGS. 5A to 5C, fourth trenches T4 penetrating the cell structure C may be formed. Fourth trenches T4 penetrating the contact structure CT may be also formed (not shown). The fourth trench T4 may be formed to have a depth that exposes all of first material layers 11, and be formed between the semiconductor patterns SP in a zigzag shape (see FIG. 5C). Openings OP may be formed by removing the first material layers 11 included in the cell structure C and the contact structure CT through the fourth trenches T4. Since the first material layers 11 included in the first to third dummy structures D1 to D3 are protected by the first and second blocking insulators 15A and 15B, the first material layers 11 may not be removed. For example, when removing the first material layers 11 by flowing etchant through the fourth trench T4, the first and second blocking insulators 15A and 15B may block the etchant from flowing into the scribe lane region SC and the page buffer region PB. Accordingly, the first material layers 11 formed in the scribe lane region SC and the page buffer region PB may not be removed. Further, even when the first material layers 11 formed in the cell region CELL are removed, the second material layers 12 remaining by the supporting insulator 15C may be prevented from collapsing.

As shown in FIGS. 6A to 6C, after forming conductive layers 17 inside the openings OP, an insulating layer 16 may be formed in the fourth trench T4. Therefore, the cell structure C may be formed, in which the conductive layers 17 and the second material layers 12 are alternately stacked, the contact structure CT in which the conductive layers 17 and the second material layers 12 are alternately stacked, the first dummy structure D1 in which the first material layers 11 and the second material layers 12 are alternately stacked, and the second dummy structure D2 in which the first material layers 11 and the second material layers 12 are alternately stacked, and the third dummy structure D3 in which the first material layers 11 and the second material layers 12 are alternately stacked.

An additional process may be performed before forming the insulating layer 16 depending on the properties of the second material layer 12. For example, when the second material layer 12 is a sacrificial layer, after removing the second material layers 12 exposed through the fourth trench T4, an insulating layer may be formed in a region in which the second material layers 12 were removed.

According to the process described above, since the first dummy structure D1 having the non-stepped shape is formed in the page buffer region PB, when forming the trenches and removing the first material layers 11, the stress applied to the cell structure C can be balanced, preventing a collapse of the structure. Accordingly, the structures, the trenches, etc., can avoid being tilted or deformed.

Figure 7:
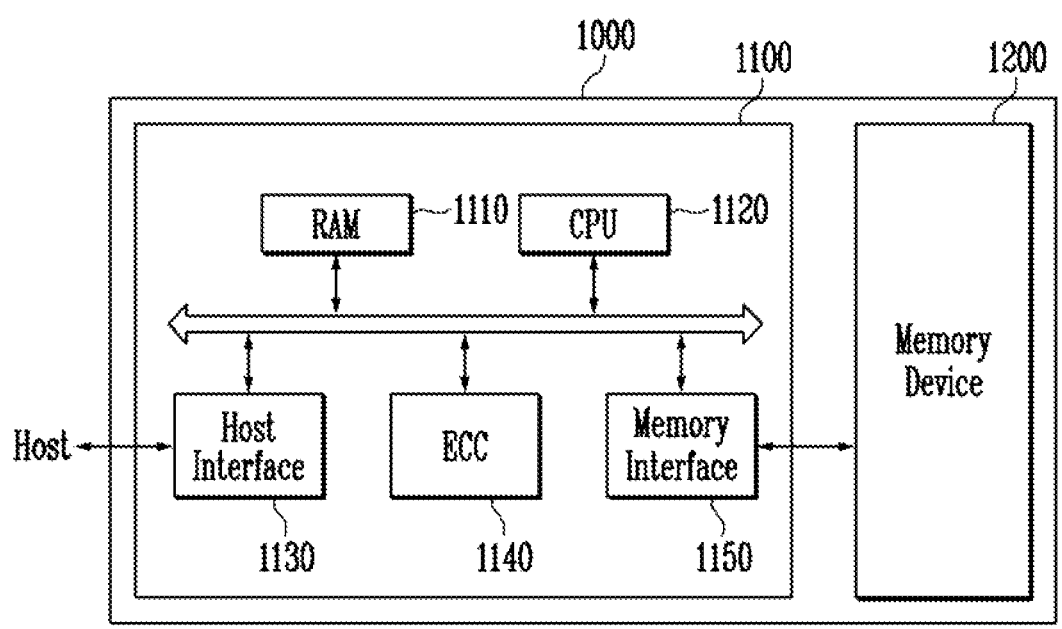
FIG. 7 is a block diagram illustrating a memory system according to an embodiment.

FIG. 7 is a block diagram illustrating construction of a memory system according to one embodiment.

As shown in FIG. 7, a memory system 1000 according to one embodiment may include a memory device 1200 and a controller 1100.

The memory device 1200 may be used for storing information having various types of data such as a text, graphics, software codes, etc.

The memory device 1200 may be a non-volatile memory, and include the structure described above with reference to FIGS. 1A to 6C. Further, the memory device 1200 may include a substrate in which a cell region, and a contact region, page buffer regions, and a scribe lane region located around the cell region are defined; a cell structure located in the cell region, including first conductive layers and first insulating layers which are alternately stacked, and having a non-stepped shape; contact structures located in the contacts region, including second conductive layers and second insulating layers which are alternately stacked, and having a stepped shape; a first dummy structure located in the page buffer region, including first sacrificial layers and third insulating layers which are alternately stacked, and having the non-stepped shape; and a second dummy structure located in the scribe lane region, including second sacrificial layers and fourth insulating layers which are alternately stacked, and having the stepped shape. Since the structure of the memory device 1200 and the method of manufacturing the same may be the same as described above, detailed descriptions are omitted.

The controller 1100 may be connected to a host and the memory device 1200, and be configured to access the memory device 1200 in response to a request from the host. For example, the controller 1100 may be configured to control read, write, erase, background operations, etc., of the memory device 1200.

The controller 1100 may include a random access memory (RAM) 1110, a central processing unit (CPU) 1120, a host interface unit 1130, an error correction code (ECC) unit 1140, a memory interface unit 1150, etc.

The RAM 1110 may be used as an operating memory of the CPU 1120, a cache memory between the memory device 1200 and the host, a buffer memory between the memory device 1200 and the host, etc. For reference, the RAM 1110 may be replaced by a static random access memory (SRAM), a read only memory (ROM), etc.

The CPU 1120 may be configured to control overall operations of the controller 1100. For example, the CPU 1120 may be configured to operate firmware such as a flash translation layer (FTL) stored in the RAM 1110.

The host interface unit 1130 may be configured to interface with the host. For example, the controller 1100 may communicate with the host through at least one of various protocols, such as, a Universal Serial Bus (USB) protocol, a multimedia card (MMC) protocol, a peripheral component interconnection (PCI) protocol, a peripheral component interconnect-express (PCI-Express) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, an integrated drive electronics (IDE) protocol, a private protocol, and the like.

The ECC unit 1140 may be configured to detect and correct an error included in data read from the memory device 1200 using an error correction code (ECC).

The memory interface unit 1150 may be configured to interface with the memory device 1200. For example, the memory interface unit 1150 may include a NAND interface or a NOR interface.

The controller 1100 may further include a buffer memory (not shown) for temporarily storing data. The buffer memory may temporarily store data transferred to the outside through the host interface unit 1130, or data transferred from the memory device 1200 through the memory interface unit 1150. Further, the controller 1100 may further include a ROM for storing code data for interfacing with the host.

Accordingly, since the memory system 1000 according to an embodiment improves structural stability, decreases the difficulty of the manufacturing process, and includes the memory device 1200 having an improved degree of integration, the stability and the degree of integration of the memory system 1000 can be improved.

Figure 8:
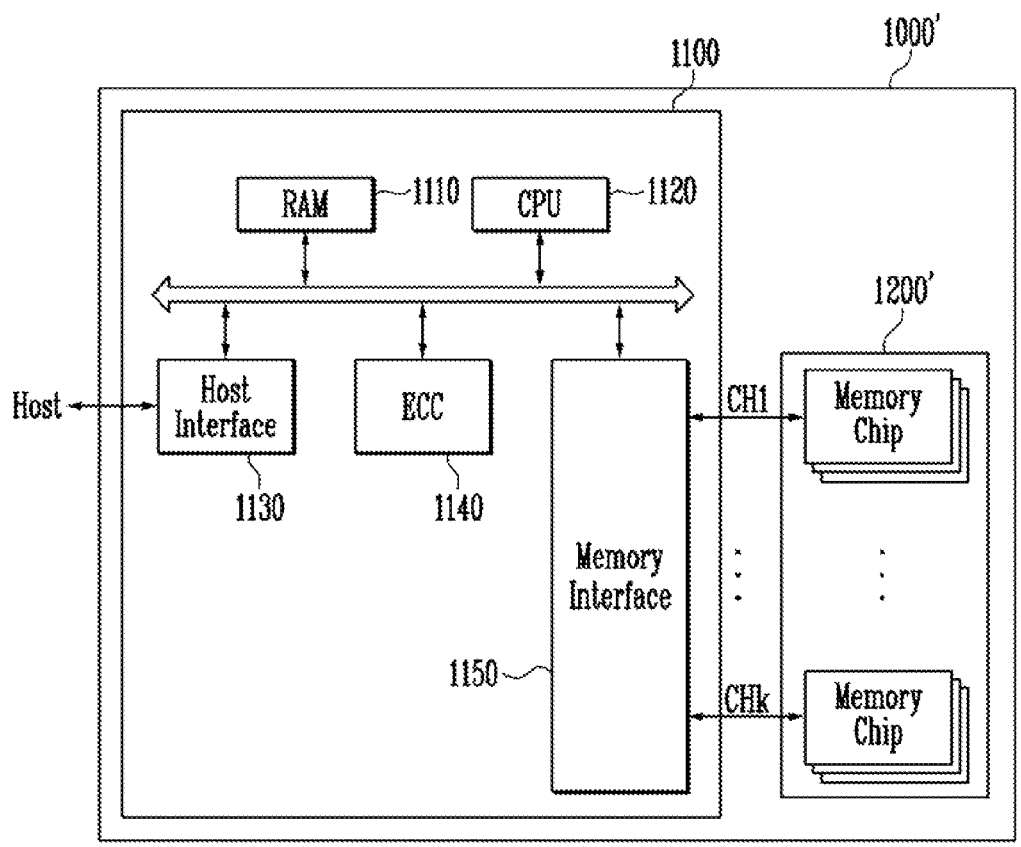
FIG. 8 is a block diagram illustrating a memory system according to an embodiment.

FIG. 8 is a block diagram illustrating the construction of a memory system according to another embodiment. Hereinafter, the descriptions of the components that have been described above may be omitted.

As shown in FIG. 8, a memory system 1000' according to another embodiment may include a memory device 1200' and a controller 1100. Further, the controller 1100 may include a RAM 1110, a CPU 1120, a host interface unit 1130, an ECC unit 1140, a memory interface unit 1150, etc.

The memory device 1200' may be a non-volatile memory, and include the memory string described above with reference to FIGS. 1A to 6C. Further, the memory device 1200' may include a substrate in which a cell region, contact regions, a page buffer region, and a scribe lane region located around the cell region are defined; a cell structure located in the cell region, including first conductive layers and first insulating layers which are alternately stacked, and having a non-stepped shape; contact structures located in the contact regions, including second conductive layers and second insulating layers which are alternately stacked, and having a stepped shape; a first dummy structure located in the page buffer region, including first sacrificial layers and third insulating layers which are alternately stacked, and having the non-stepped shape; and a second dummy structure located in the scribe lane region, including second sacrificial layers and fourth insulating layers which are alternately stacked, and having the stepped shape. Since the structure of the memory device 1200' and the method of manufacturing the same may be the same as described above, detailed descriptions are omitted.

In addition, the memory device 1200' may be a multi-chip package having multiple memory chips. The memory chips may be divided into groups, and the groups may be configured to communicate with the controller 1100 through first to k-th channels CH1 to CHk. Further, the memory chips included in one group may be configured to communicate with the controller 1100 through a common channel. For reference, it may be possible to configure the memory system 1000' so that one memory chip is connected to one channel.

Accordingly, since the memory system 1000' according to an embodiment improves structural stability, decreases the degree of difficulty of the manufacturing process, and includes the memory device 1200' having an improved degree of integration, the stability and the degree of integration of the memory system 1000' can also be improved. Specifically, data storage capacity of the memory system 1000' can be increased and the driving speed thereof can be improved by configuring the memory device 1200' as a multi-chip package.

Figure 9:
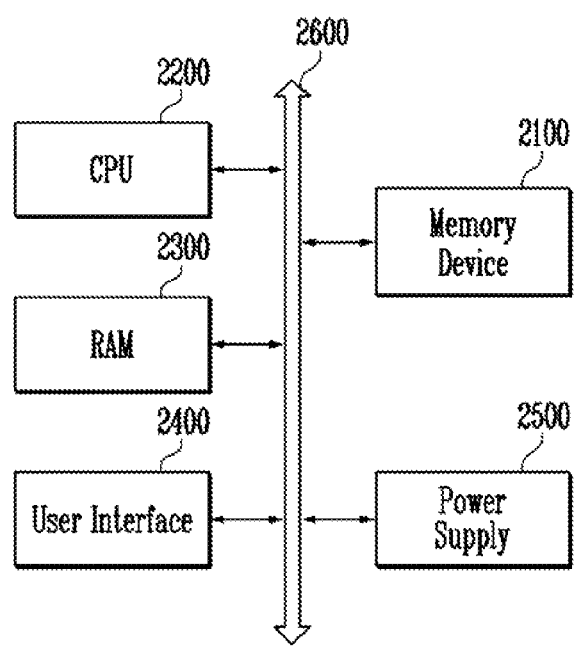
FIG. 9 is a block diagram illustrating a computing system according to an embodiment.

FIG. 9 is a block diagram illustrating the construction of a computing system according to an embodiment. Hereinafter, the descriptions of components that have been described above may be omitted.

As shown in FIG. 9, a computing system 2000 according to an embodiment may include a memory device 2100, a CPU 2200, a RAM 2300, a user interface unit 2400, a power supply unit 2500, a system bus 2600, etc.

The memory device 2100 may store data provided through the user interface unit 2400, and data processed by the CPU 2200. Further, the memory device 2100 may be electrically connected to the CPU 2200, the RAM 2300, the user interface unit 2400, the power supply unit 2500, etc., through a system bus 2600. For example, the memory device 2100 may be connected to the system bus 2600 through the controller (not shown), or directly connected to the system bus 2600. When the memory device 2100 is directly connected to the system bus 2600, the functions of the controller may be performed by the CPU 2200, the RAM 2300, etc.

The memory device 2100 may be a non-volatile memory, and include the memory string described above with reference to FIGS. 1A to 6C. Further, the memory device 2100 may include a substrate in which a cell region, contact regions, a page buffer region, and a scribe lane region located around the cell region are defined; a cell structure located in the cell region, including first conductive layers and first insulating layers which are alternately stacked, and having a non-stepped shape; contact structures located in the contact regions, including second conductive layers and second insulating layers which are alternately stacked, and having a stepped shape; a first dummy structure located in the page buffer region, including first sacrificial layers and third insulating layers which are alternately stacked, and having the non-stepped shape; and a second dummy structure located in the scribe lane region, including second sacrificial layers and fourth insulating layers which are alternately stacked, and having the stepped shape. Since the structure of the memory device 2100 and the method of manufacturing the same may be the same as described above, detailed descriptions are omitted.

In addition, the memory device 2100 may be a multi-chip package having multiple memory chips as described above with reference to FIG. 8.

The computing system 2000 may include at least one of an ultra mobile personal computer (UMPC), a workstation, a net-book, a personal digital assistant (PDA), a portable computer, a web tablet, a wireless phone, a mobile phone, a smart phone, an e-book, a portable multimedia player (PMP), a portable game console, a navigation device, a black box, a digital camera, a three-dimensional television, a digital audio recorder, a digital audio player, a digital picture recorder, a digital picture player, a digital video recorder, a digital video player, a device for wirelessly transmitting and receiving information, various electronic devices configuring a home network, various electronic devices configuring a computer network, various electronics devices configuring a Telematics network, a radio frequency identification (RFID) device, etc.

Since the computing system 2000 according to an embodiment improves structural stability, decreases the degree of difficulty of the manufacturing process, and includes the memory device 2100 having an improved degree of integration, the stability and data storage capacity of the computing system 2000 can also be improved.

Figure 10:
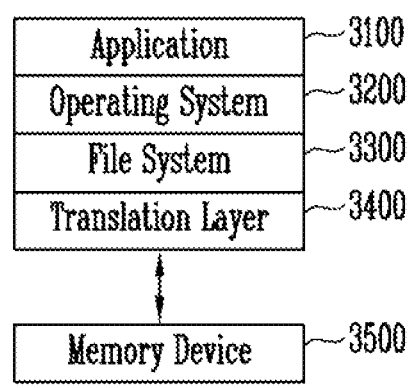
FIG. 10 is a block diagram illustrating a computing system according to an embodiment.

FIG. 10 is a block diagram illustrating a computing system according to an embodiment.

As shown in FIG. 10, a computing system 3000 may include a software layer including an operating system 3200, an application 3100, a file system 3300, a translation layer 3400, etc. Further, the computing system 300 may include a hardware layer such as a memory device 3500, etc.

The operating system 3200 may manage software and hardware resources, etc., of the computing system 3000, and control executions of programs of the CPU. The application 3100 may be various application programs executed in the computing system 3000, and be utilities executed by the operating system 3200.

The file system 3300 may denote a physical structure for managing data, files, etc., present in the computing system 3000, and systematize the files or data that will be stored in the memory device 3500 according to various rules. The file system 3300 may be determined according to the operating system 3200 used in the computing system 3000. For example, when the operating system 3200 is a Microsoft Windows-based system, the file system 3300 may be a file allocation table (FAT), a new technology file system (NTFS), etc. Further, when the operating system 3200 is Unix/Linux-based system, the file system 3300 may be an extended file system (EXT), a UNIX file system (UFS), a journaling file system (JFS), etc.

In FIG. 10, the operating system 3200, the application 3100 and the file system 3300 are illustrated as separate blocks, but the application 3100 and the file system 3300 may be included in the operating system 3200.

The translation layer 3400 may convert an address into an address suitable for the memory device 3500 in response to a request from the file system 3300. For example, the translation layer 3400 may convert a logical address generated by the file system 3300 into a physical address of the memory device 3500. Mapping information of the logical address and the physical address may be stored as an address translation table. For example, the translation layer 3400 may be a flash translation layer (FTL), a universal flash storage link layer (ULL), etc.

The memory device 3500 may be a non-volatile memory and include the memory string described above with reference to FIGS. 1A to 6C. Further, the memory device 3500 may include a substrate in which a cell region, contact regions, a page buffer region, and a scribe lane region located around the cell region are defined; a cell structure located in the cell region, including first conductive layers and first insulating layers which are alternately stacked, and having a non-stepped shape; contact structures located in the contact regions, including second conductive layers and second insulating layers which are alternately stacked, and having a stepped shape; a first dummy structure located in the page buffer region, including first sacrificial layers and third insulating layers which are alternately stacked, and having the non-stepped shape; and a second dummy structure located in the scribe lane region, including second sacrificial layers and fourth insulating layers which are alternately stacked, and having the stepped shape. Since the structure of the memory device 3500 and a method of manufacturing the same may be the same as described above, detailed descriptions are omitted.

The computing system 3000 may be classified as an operating system layer performed in an upper level area, and a controller layer performed in a lower level area. The application 3100, the operating system 3200, and the file system 3300 may be included in the operating system layer, and driven by an operating memory of the computing system 300. Further, the translation layer 3400 may be included in the operating system layer or the controller system layer.

Since the computing system 3000 according to an embodiment improves structural stability, decreases manufacturing difficulty, and includes the memory device 3500 having an improved degree of integration, the stability and data storage capacity of the computing system 3000 can be improved.

The semiconductor device may include the dummy structure located in the page buffer region and having the non-stepped shape, and a blocking insulator located between the cell structure and the dummy structure. Accordingly, the structural stability of the semiconductor device can be improved, and the manufacturing of the semiconductor device may be simplified.

In the drawings and specification, embodiments of the present invention have been disclosed, and although specific terms are employed, they are used in a generic and descriptive sense only and not for the purpose of limitation. As for the scope of the invention, it is to be set forth in the following claims. Therefore, it will be understood by those of ordinary skill in the art that various changes in form and detail may be made without departing from the spirit and scope of the present invention as defined by the following claims.

What is claimed is:

1. A method of manufacturing a semiconductor device, comprising:
   forming a stacked structure in which first material layers and second material layers are alternately stacked on a substrate having a cell region, contact regions, a page buffer region, and a scribe lane region, wherein the contact regions, the page buffer region, and the scribe lane region are disposed around the cell region; and
   patterning the stacked structure, and forming a cell structure having a non-stepped shape located in the cell region, a contact structure having a stepped shape located in each of the contact regions, a first dummy structure having the non-stepped shape located in the page buffer region, and a second dummy structure having the stepped shape located in the scribe lane region,
   wherein each of the cell structure, the contact structure, the first dummy structure and the second dummy structure includes the first material layers and second material layers that are alternately stacked.

2. The method of claim 1, wherein the patterning of the stacked structure comprises:
   forming a mask pattern on the stacked structure; and
   etching the stacked structure a number of times while reducing the mask pattern so that the mask pattern covers the cell region and the page buffer region, and the contact regions, and the scribe lane region are gradually exposed.

3. The method of claim 1, wherein the contact regions contact a first side and a second side of the cell region which face each other, and the scribe lane region and the page buffer region contact a third side and a fourth side of the cell region which face each other so that the cell region is located between the scribe lane region and the page buffer region.

4. The method claim 1, further comprising:
   forming a first trench located between the cell structure and the first dummy structure; and
   forming a first blocking insulator in the first trench.

5. The method of claim 4, further comprising:
   forming a second trench penetrating the cell structure, after forming the first blocking insulator;
   selectively removing the first material layers included in the cell structure through the second trench; and forming conductive layers in areas in which the first material layers are removed.

6. The method of claim 5, wherein the first material layers included in the contact structure are removed through the second trench, and conductive layers are formed in areas from which the first material layers are removed.

7. The method of claim 5, wherein the first material layers of the first dummy structure are protected by the first blocking insulator when the first material layers of the cell structure are removed.

8. The method of claim 4, wherein the first blocking insulator separates the cell structure and the first dummy structure from each other.

9. The method of claim 1, further comprising:
forming a third trench located between the cell structure and the second dummy structure; and
forming a second blocking insulator in the third trench.

10. The method of claim 9, wherein the second blocking insulator separates the cell structure and the second dummy structure from each other.

11. The method of claim 9, further comprising:
forming a fourth trench passing through the cell structure, after forming the first blocking insulator;
selectively removing the first material layers included in the cell structure through the fourth trench; and
forming conductive layers in areas from which the first material layers are removed.

12. The method of claim 11, wherein the first material layers included in the contact structure are removed through the fourth trench, and conductive layers are formed in areas from which the first material layers are removed.

13. The method of claim 11, wherein the first material layers of the second dummy structure are protected by the first blocking insulator when the first material layers of the cell structure are removed.

14. A method of manufacturing a semiconductor device, comprising:
forming a stacked structure in which sacrificial layers and insulating layers are alternately stacked, wherein the stacked structure includes a cell region, a contact region, a page buffer region, and a scribe lane region;
patterning the stacked structure, wherein the stacked structure has a non-stepped shape in the cell region and the page buffer region, and a stepped shape in the contact region and the scribe lane region;
forming first and second blocking insulators passing through the stacked structure, wherein the first blocking insulator separates the cell region and the page buffer region from each other, and the second blocking insulator separates the cell region and the scribe lane region from each other;
forming a trench passing through the stacked structure in the cell region; and
selectively replacing the sacrificial layers with conductive layers in the cell region and the contact region.

15. The method of claim 14, wherein the sacrificial layers in the page buffer region and a scribe lane region are protected by the blocking insulators and remained in the stacked structure.

* * * * *